Aug. 4, 1970 N. P. JOHNS ET AL 3,522,486

CONTROL APPARATUS

Filed April 19, 1968 2 Sheets-Sheet 1

INVENTORS
NORMAN P. JOHNS
CLYDE M. KOBE
LOUIS A. LARSON

BY Bruce C Lutz

ATTORNEY

Aug. 4, 1970 N. P. JOHNS ET AL 3,522,486

CONTROL APPARATUS

Filed April 19, 1968 2 Sheets-Sheet 2

INVENTORS
NORMAN P. JOHNS
CLYDE M. KOBE
LOUIS A. LARSON

BY Bruce C Lutz

ATTORNEY

United States Patent Office 3,522,486

Patented Aug. 4, 1970

3,522,486

CONTROL APPARATUS

Norman P. Johns, Minneapolis, Clyde M. Kobe, New Brighton, and Louis A. Larson, Minneapolis, Minn., assignors to Honeywell Inc., Minneapolis, Minn., a corporation of Delaware Filed Apr. 19, 1968, Ser. No. 722,691
Int. Cl. H05k *1/04;* H02b *1/04*
U.S. Cl. 317—101 3 Claims

ABSTRACT OF THE DISCLOSURE

A weight saving packaging technique utilizing flexible printed electrical circuitry encapsulated in low density potting material thereby providing a rigid potted module having a substantial weight reduction over conventional modules using rigid metal module frames for the flexible circuitry and wherein further weight saving is effected when connecting the potted module to external circuitry by forming the conductors of the electrical circuitry into connector pins which may be inserted into holes in conductors of interconnecting cabling.

The present invention pertains to the field of electrical circuitry and more particularly to protective packaging for electrical circuits.

In modern aerospace systems, there is a continuing demand for smaller and lighter electrical assemblies. One means for meeting the demand has been the development of functional electronic blocks which are formed on insulated substrates such as glass, fused silica or ceramic. The blocks may include a variety of discrete active components and passive components fabricated by various deposition techniques onto the substrates. Circuits constructed using deposition techniques offer significant weight and space saving advantages over prior art circuits constructed from individual components. When a large number of circuits are to be used to form an electronic assembly, much of the size and weight advantage over circuits constructed utilizing individual parts may be lost if conventional interconnection techniques are used in the packaging of the various circuits. Thus, a space and weight saving packaging technique is required to fully obtain the benefits which may accrue from the usage of functional electronic blocks.

In the present invention, a circuit board constructed from flexible printed circuit material is used as a mounting base for functional electronic blocks. Rigidity of the resultant flexible circuit card is obtained by overlaying the card with foam potting material. The resulting foam potted module exhibits a substantial weight reduction over conventional modules utilizing rigid metal module frames. In addition to increasing the strength of the printed circuit card, the foam provides a seal to prevent humidity from deteriorating the performance of the functional electronic blocks enclosed within the foam.

The foam potted circuit card of the present invention is connected to flexible printed circuit interconnecting cabling by techniques not requiring the use of an interfacing connector. The conductors of the circuit card are formed into connector pins which are inserted into holes in the conductors of the printed circuit interconnecting cabling. Electrical connections are completed by soldering the junctions of the circuit card pins and the conductors of the interconnecting cable.

It is therefore a general object of the present invention to provide an improved packaging technique for miniaturized electronic circuitry.

A further object of the present invention is to provide a lighter and smaller electronic circuit assembly.

A still further object of the present invention is to provide an electronic package which is a rugged environmentally sealed unit.

Further objects and advantages will become apparent from a reading of the specification and claims in conjunction with the drawings wherein:

Figure 1:
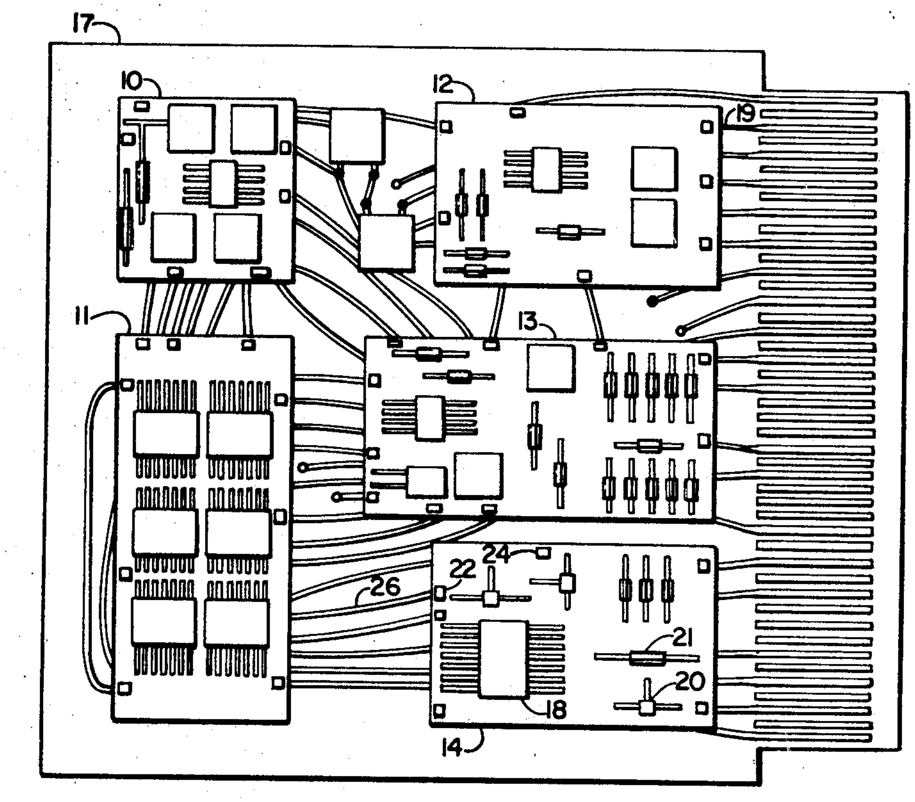
FIG. 1 is an elevation view of a flexible circuit card.

In FIG. 1 functional electronic blocks 10–14 are shown mounted on a flexible printed circuit sheet 17. Each of the functional blocks may include various commercially available integrated or hybrid circuits such as circuit 18 shown on functional electronic block 14. Individual components such as transistor 20 or resistor 21 of functional block 14 may also be mounted on functional electronic blocks. The interconnecting wiring of the components mounted on the functional electronic blocks is not shown in the drawings. Connections from the functional electronic blocks to flexible conductors connected to other circuitry are made from terminals such as 22 and 24 of functional block 14.

Printed circuit sheet 17 is a laminate of copper and plastic film material. All the copper is removed by etching except the conductors such as 26. Because of the translucent nature of the material used in sheet 17 the conductors are shown as visible. Connections between the functional electronic blocks and the printed circuit wiring are accomplished by connecting terminals such as 22 to conductors such as 26 and making the connections permanent by conventional soldering techniques.

Figures 2A, 2B:
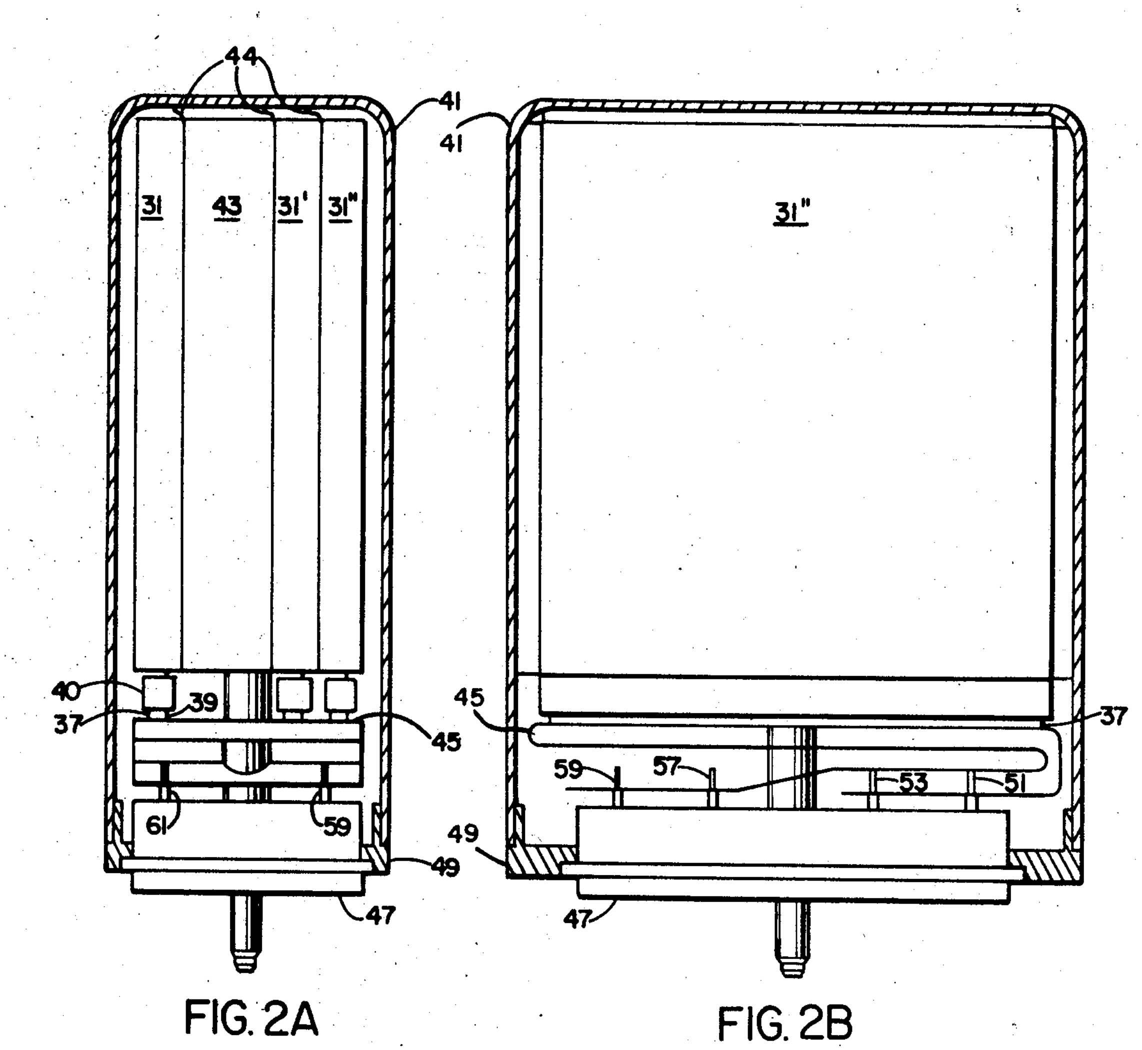
FIGS. 2A and 2B are cross-sectional views of an electronic circuit assembly utilizing the present invention.

FIGS. 2A and 2B show end and side cross-sectional views of an assembled electronic circuit package utilizing several printed circuit cards as illustrated in FIG. 1.

FIG. 2A is an end cross-sectional view of an electronic assembly showing foam potted modules 31, 31′, and 31″. The foam potted modules are formed by encapsulating the assembled printed circuit card in a polyurethane foam potting material as shown in FIG. 1. A portion of the printed circuit conductor is left unpotted at the edge of the flexible circuit sheet such as sheet 17 in FIG. 1. The flexible insulating sheet is cut away between the conductors to leave a series of strips projecting from the potted module each strip having a conductive and a non-conductive surface. The conductive strips are formed into pins by crimping the strips around a form such that the conductive surface becomes an outside surface of a substantially cylindrical pin such as pin 37 and pin 39 shown in FIG. 2A. Alternate pins may be bent so that two parallel rows of pins result. A strip of potting 40 is then applied to hold the pins in a fixed relationship to each other. Strip 40 is applied slightly displaced from the body of module 31 to allow for some flexible movement of the strip during assembly. Modules 31′ and 31″ are constructed similarly to module 31. The modules 31, 31′, and 31″ are inserted into a housing portion 41. Further foam potting material such as 43 may be used to separate the potted modules. Conductive aluminum shims 44 are inserted between potted modules of the preferred embodiment to act as heat conductors to remove heat from various power dissipating portions of the modules. The aluminum shims may be terminated by mechanical connection to housing 41.

A flexible printed circuit interconnecting cable 45 comprising a sheet of flexible nonconductive material with conductors attached thereto is shown in FIGS. 2A and 2B connected to potted modules 31, 31′, and 31″. The connections between interconnecting cable 45 and module pins such as 37 and 39 are soldered. Interconnecting cable 45 is also connected to a connector 47 which is mounted on a cover 49. When cover 49 is attached to housing 41 a hermetic seal may be provided for components within the housing. This hermetic seal is in the preferred embodiment of the crimped type. Pins 51, 53, 57, 59 and 61 are shown projecting from connector 47. The pins are electrically connected to the conductors on the interconnecting cabling 45 and thus to the pins of the potted modules.

From the above description it may be seen that an electronic assembly utilizing functional electronic blocks and flexible printed circuitry may be made lighter and stronger than similar circuit assemblies constructed using rigid metal module frames and individual components.

Alternations and variations will be obvious to one skilled in the art. For example, a multifield card can be constructed by placing components on a printed circuit sheet having several rows interconnecting pins. The sheets are then foldd and the foam potting is encapsulated over the card forming multiple sheet module. We do not wish to be limited to the specification or the preferred embodiment shown in the figures but only to the following claims.

We claim:

1. An electronic assembly, comprising in combination:
an electrical circuit bearing substrate having a plurality of terminal contacts formed thereon;
a plurality of flexible nonconducting sheets, each of which has conductors attached to at least one side thereof;
means for connecting for support a substrate to each of said sheets;
means for electrically connecting said terminals of a substrate to said conductors of its supporting sheet;
low density potting material encapsulated about each of a plurality of flexible nonconducting sheets and including the electrical circuit bearing substrates attached thereto to provide structural rigidity;
a flexible printed circuit cable comprising a sheet of flexible nonconducting material with conductors attached thereto; and
means for electrically interconnecting the conductors of said plurality of flexible nonconducting sheets to the conductors of said flexible printed circuit cable, wherein said means for electrically connecting the conductors of said plurality of flexible nonconducting sheets to the conductors of said flexible printed circuit cable are conductive pins formed by removing a portion of the flexible nonconducting material of said flexible nonconductive sheets from between the conductors theron and crimping each remaining lamina of conductor and flexible nonconductive material into a conductive pin wherein the conductor forms an outer surface.

2. A printed circuit sheet comprising a laminate of conductive material and insulating plastic film material wherein the conductive material is removed except for conductor portions thereof wherein at an edge portion of the sheet the flexible insulating material is cut away between the conductors or conductor portions to leave a series of strips projecting, each projecting strip having a conductive and a nonconductive surface, with the strips being shaped into electrical conductive pins by crimping the strips around a form such that the conductive surface becomes the outside surface.

3. Apparatus of the class described in claim 1 wherein the interconnection between the flexible circuit portions and the flexible printed circuit cable is a soldered connection.

References Cited

UNITED STATES PATENTS

| | | | |
|---|---|---|---|
| 2,857,558 | 10/1958 | Fiske | 317—101 |
| 3,029,495 | 4/1962 | Doctor | 317—101 |
| 3,356,904 | 12/1967 | Yonkers | 317—100 |
| 3,406,368 | 10/1968 | Curran | 317—101 |

OTHER REFERENCES

"Flexible Printed Wiring," advertising Sanders Associates in Mar. 14, 1958, engineering edition of Electronics, p. 20.

LEWIS H. MYERS, Primary Examiner

G. P. TOLIN, Assistant Examiner

U.S. Cl. X.R.

317—100; 339—17; 174—68.5